(12) United States Patent
Takazaki

(10) Patent No.: US 9,469,765 B2
(45) Date of Patent: *Oct. 18, 2016

(54) GOLDEN RIGID DECORATIVE MEMBER

(71) Applicants: CITIZEN HOLDINGS CO., LTD., Tokyo (JP); CITIZEN WATCH CO., LTD., Tokyo (JP)

(72) Inventor: Koutarou Takazaki, Saitama (JP)

(73) Assignees: CITIZEN HOLDINGS CO., LTD., Tokyo (JP); CITIZEN WATCH CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/385,166

(22) PCT Filed: Feb. 28, 2013

(86) PCT No.: PCT/JP2013/055486
§ 371 (c)(1),
(2) Date: Sep. 14, 2014

(87) PCT Pub. No.: WO2013/140988
PCT Pub. Date: Sep. 26, 2013

(65) Prior Publication Data
US 2015/0044453 A1    Feb. 12, 2015

(30) Foreign Application Priority Data

Mar. 19, 2012  (JP) ................................ 2012-062218

(51) Int. Cl.
C23C 14/06    (2006.01)
C09D 1/00     (2006.01)
(Continued)

(52) U.S. Cl.
CPC ............... *C09D 1/00* (2013.01); *A44C 27/007* (2013.01); *C23C 14/0015* (2013.01); *C23C 14/0036* (2013.01); *C23C 14/025* (2013.01);
(Continued)

(58) Field of Classification Search
USPC ................. 428/336, 697, 698, 699; 204/192, 204/192.15, 192.16
See application file for complete search history.

(56) References Cited

U.S. PATENT DOCUMENTS

| | | | |
|---|---|---|---|
| 9,120,933 B2 * | 9/2015 | Takazaki | C23C 14/0015 |
| 2005/0109607 A1 * | 5/2005 | Ehiasarian | C23C 14/022 |
| | | | 204/192.15 |

(Continued)

FOREIGN PATENT DOCUMENTS

| | | | |
|---|---|---|---|
| DE | 102004044919 | * | 3/2006 |
| EP | 0558061 | * | 9/1993 |

(Continued)

OTHER PUBLICATIONS

International Search Report for PCT/JP2013/055486, Apr. 2, 2013.
(Continued)

*Primary Examiner* — Archene Turner

(57) ABSTRACT

A golden rigid decorative member in which scratch resistance and abrasion resistance are significantly improved and deterioration of appearance quality due to a flaw, abrasion, or the like is suppressed, and which has a pale color with a high quality feel is stably provided. A single layer or several layers of a coating including a reaction compound of an alloy of Ti and one or two or more metals selected from Nb, Ta, and V, and of one or two non-metallic elements mainly including nitrogen and selected from carbon and oxygen are stacked on a base.

9 Claims, 12 Drawing Sheets

(51) Int. Cl.

| | |
|---|---|
| C23C 14/00 | (2006.01) |
| C23C 14/02 | (2006.01) |
| C23C 14/34 | (2006.01) |
| A44C 27/00 | (2006.01) |
| C23C 14/14 | (2006.01) |
| G04B 37/22 | (2006.01) |

(52) U.S. Cl.
CPC ....... *C23C14/0641* (2013.01); *C23C 14/0676* (2013.01); *C23C 14/14* (2013.01); *C23C 14/3414* (2013.01); *G04B 37/221* (2013.01); *A44C 27/005* (2013.01); *Y10T 428/265* (2015.01)

(56) References Cited

U.S. PATENT DOCUMENTS

| | | |
|---|---|---|
| 2008/0014420 A1 | 1/2008 | Chan |
| 2012/0128971 A1 | 5/2012 | Shibata |

FOREIGN PATENT DOCUMENTS

| | | |
|---|---|---|
| JP | S54-85214 A | 7/1979 |
| JP | H02-138460 A | 5/1990 |
| JP | H11-302831 A | 11/1999 |
| JP | 2003-82452 A | 3/2003 |
| JP | 2011-256424 A | 12/2011 |
| WO | 2010/150411 A1 | 12/2010 |
| WO | 2011/016488 A1 | 2/2011 |

OTHER PUBLICATIONS

European Patent Office, Extended European Search Report for EP Patent Application No. 13765078.4, Oct. 2, 2015.

State Intellectual Property Office of the People's Republic of China, Search Report for Chinese patent application No. 2013800150939, Jul. 26, 2016.

Hu Chuanxi, "Handbook of Surface Treatment Technology", Jul. 31, 2009, p. 680, Beijing University of Technology Press.

Cai Lan, "Handbook of Mechanical Part Manufacturability (version 2)", Feb. 28, 2007, pp. 420-421.

\* cited by examiner

GOLDEN RIGID DECORATIVE MEMBER

TECHNICAL FIELD

The present invention relates to decorative members having metallic colors for exterior parts of watches, personal ornaments such as glasses and accessories, decorative trim, and the like, and sporting goods, and particularly relates to a golden rigid decorative member with a pale color that is highly bright and has a high quality feel, and is excellent in scratch resistance, abrasion resistance, and an anticorrosion property for a long period.

BACKGROUND ART

A pale gold-tinted plating coating has been conventionally formed on the outermost layer of an abrasion-resistant layer for improving the scratch resistance of exterior parts, personal ornaments such as glasses, accessories, and watches, decorative trims, sporting goods, and the like in order to make an appearance with a high quality feel. The pale gold-tinted plating coating has been often formed by a wet plating method using a gold alloy of gold, and nickel, copper, silver, cobalt, cadmium, tin, or the like, as coating composition.

However, the alloy plating coating obtained by the wet plating method has had a color tone changed depending on the thickness of a coating, a current value, the shape of a base to be plated, and the like, it has not been easy to control the color tone, and therefore, unevenness in the color tone has been prone to occur in production.

Further, the gold alloy plating coating obtained by the wet plating method has had a low hardness, a Vickers hardness of 250 Hv or less in formation with a thickness of 10 µm, and has been poor in abrasion resistance, and therefore, the coating having a thickness of 30 µm or more has been generally formed and has been economically disadvantageous since gold which is a noble metal has been expensive.

Thus, Patent Literature 1 proposes that a golden coating having composition consisting of 80 to 95% by weight of gold, 5 to 20% by weight of nickel, and the other unavoidable components is formed on a titanium nitride (TiN) film by a dry plating method, whereby a pale gold-tinted decorative coating that is excellent in abrasion resistance and has a high quality feel is obtained.

The gold-tinted coating of Patent Literature 1 has had advantages that control of a color tone has been easy compared to conventional wet plating and abrasion resistance has been also improved; however, since a gold alloy has been used, the cost thereof has been still high, and it has not been able to be considered that the abrasion resistance has been sufficient.

Further, as a method for forming a coating presenting a gold color using a metal other than gold, a method of coating a nitride such as titanium nitride (TiN) or tantalum nitride (TaN) has been conventionally utilized. The method has had a defect in a production process that the partial pressure of a nitrogen gas has been preferably precisely controlled since the rate of nitrogen included in the nitride has greatly influenced a color tone.

Thus, Patent Literature 2 proposes that a first metal including at least one element of Group IVa elements of the periodical table and a second metal including at least one element of Group Va elements or Group VIa elements are used as targets, the two metals are simultaneously used as the targets in nitrogen atmosphere, reactive sputtering of an object is carried out simultaneously with the two metals in the nitrogen atmosphere, and the two metals are allowed to act as a buffer on a reaction system in which the Group IVa element reacts with nitrogen, whereby a coating is formed under relaxed conditions for controlling the partial pressure of nitrogen.

However, the method of Patent Literature 2 has had a problem that since the coating has been formed using the target including an element of Group IVa elements of the periodical table and the target of a metal including Group Va elements or Group VIa elements, the two metals in the obtained coating have prevented a uniform alloy nitride from being formed, it has been difficult to control a color tone, productivity has been poor, and it has been impossible to stably form a pale golden coating with a high quality feel.

CITATION LIST

Patent Literature

Patent Literature 1: Japanese Laid-open Patent Publication No. 2003-82452
Patent Literature 2: Japanese Laid-open Patent Publication No. 2-138460

SUMMARY OF INVENTION

Technical Problem

An object of the present invention is to solve the problems of such conventional gold-tinted coatings as described above and to stably provide a golden rigid decorative member in which scratch resistance and abrasion resistance are significantly improved and deterioration of appearance quality due to a flaw, abrasion, or the like is suppressed, and which is highly bright and a pale color with a high quality feel.

Solution to Problem

The decorative member of the present invention includes a golden coating with a pale color, including a reaction compound of an alloy of Ti and a metal selected from one or more of Group Va elements (Nb, Ta, V) having high hardness and of a non-metallic element mainly including nitrogen. As a production method for generating such a compound coating of an alloy and a non-metallic element, there is provided a method of forming the coating by a reactive sputtering method using an alloy target of Ti and one or two or more metals selected from Nb, Ta, and V.

Further, the coating is formed on a substrate in the order of an adhesion layer, a gradient adhesion layer, an abrasion-resistant layer, and a golden adjustment gradient layer as plural layers, whereby a golden rigid decorative member having a pale color with a high quality feel in which scratch resistance and abrasion resistance to flaws, abrasion, and the like are significantly improved can be stably provided.

In order to achieve the above-described object, the golden rigid decorative member of the present invention employs configurations described below.

Aspects of the present invention are as follows:

(1) A rigid decorative member including:
a base; and
a rigid decorative coating with a single layer or plural layers including a reaction compound of an alloy of Ti and one or two or more metals selected from Nb, Ta, and V, and of one or two or more non-metallic elements selected from nitrogen, oxygen, and carbon on the base.

(2) The rigid decorative member according to the above (1), wherein the non-metallic element in the rigid decorative coating mainly includes nitrogen.

(3) The rigid decorative member according to the above (1), containing the rigid decorative coating with the plural layers, wherein the plural rigid decorative coatings include an adhesion layer stacked on a substrate, a gradient adhesion layer stacked on the adhesion layer, an abrasion-resistant layer stacked on the gradient adhesion layer, and a golden adjustment gradient layer stacked on the abrasion-resistant layer; a non-metallic element in the adhesion layer is low-concentration oxygen; a non-metallic element in the gradient adhesion layer, the abrasion-resistant layer, and the golden adjustment gradient layer mainly includes nitrogen and is selectively selected from carbon and oxygen; the content of a non-metallic element in a reaction compound included in the gradient adhesion layer is increased in a gradient manner in a thickness direction with departing from the substrate; and the content of a non-metallic element in a reaction compound included in the golden adjustment gradient layer is increased or decreased in a gradient manner in a thickness direction with departing from the substrate.

(4) The rigid decorative member according to any of the above (1) to (3), wherein the alloy proportion of the Ti is 25 wt % or more.

(5) The rigid decorative member according to any of the above (1) to (4), wherein the appearance color of the golden adjustment gradient layer is a pale gold color.

(6) The rigid decorative member according to any of the above (1) to (5), wherein the thickness of the abrasion-resistant layer is 0.5 to 4 μm.

(7) The rigid decorative member according to any of the above (1) to (6), wherein a value of L*, exhibiting brightness in Lab color space displaying, of the rigid decorative coating is 78 or more.

(8) A watch including an exterior part of which at least one portion includes the rigid decorative member according to any of the above (1) to (7).

(9) A method for producing the rigid decorative member according to any of the above (1) to (8), including forming the rigid decorative coating layer by a reactive sputtering method using an alloy target of Ti and one or two or more metals selected from Nb, Ta, and V.

(10) The method for producing a rigid decorative member according to the above (9), wherein a reactant gas containing the non-metallic element is used in the reactive sputtering method; and the gradient adhesion layer and the golden adjustment gradient layer are formed by chronologically increasing or decreasing the amount of the reactant gas containing the non-metallic element.

Advantageous Effects of Invention

In accordance with the present invention, there can be provided a golden rigid decorative member in which deterioration of appearance quality due to a flaw, abrasion, or the like is suppressed, and which has a pale color that is highly bright and a color tone with a high quality feel, and there can be provided a method capable of stably producing the golden rigid decorative member.

DESCRIPTION OF EMBODIMENTS

Embodiments of the present invention will be explained below with reference to the drawings.

Figure 1:
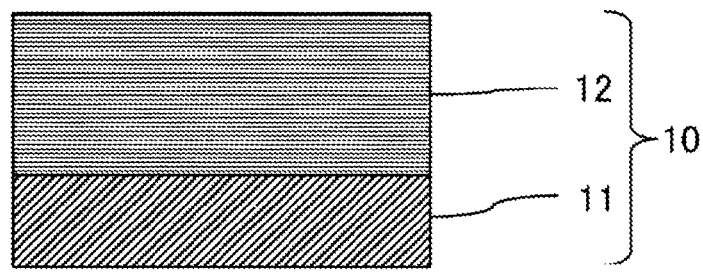
FIG. 1 illustrates one example of a cross-sectional schematic view of a golden rigid decorative member of a first embodiment of the present invention.

A first embodiment of the present invention is a golden rigid decorative member in which a rigid decorative coating with a single layer is formed. FIG. 1 illustrates a cross-sectional schematic view of the golden rigid decorative member of the first embodiment of the present invention. A rigid decorative film 12 including a TiNb alloy nitride film presenting a pale gold color is formed on a surface of an SUS316L base 11 as a base. The TiNb alloy nitride film has characteristics in that the TiNb alloy nitride film presents a pale gold color, and has high brightness and high abrasion resistance, compared to TiN which has been conventionally used as a golden film.

The composition of the alloy of the rigid decorative coating and the composition of the non-metallic element can be determined by demanded properties, particularly a color. In general, the increased rate of nitrogen in the non-metallic element is preferred for obtaining a pale gold color with a high quality feel, and in addition to nitrogen, carbon and oxygen are added to thereby enable improvement in hardness. Further, even in the same gold tint, the tint can be changed from a pink tint to a brown tint by adjusting the amounts of nitrogen, carbon, and oxygen.

The base 11 is preferably a base formed of a metal or ceramic. Specific examples of metals (including alloys) include stainless steel, titanium, titanium alloy, copper, copper alloy, tungsten, or stainless steel, titanium, and titanium alloy subjected to hardening treatment, and the like. The metals may be used singly or in combination of two or more kinds. Further, the shape of the base 11 is not limited.

The rigid decorative coating includes a reaction compound of an alloy of Ti and one or two or more metals selected from Nb, Ta, and V, and of one or two or more non-metallic elements selected from nitrogen, oxygen, and carbon. The non-metallic element mainly includes nitrogen. As the alloy, for example, an alloy in which Ti and one or two or more metals selected from Nb, Ta, and V are variously combined, such as TiNb, TiTa, TiV, or TiNbV, can be employed. Adhesion performance, film hardness, scratch resistance performance, abrasion resistance performance, a color tone, corrosion resistance performance, etching performance, and allergy performance can be freely controlled by the proportion of each metal included in the alloy.

In addition to the metals, a metal such as Cr, Mo, W, Zr, Hf, B, Al, Si, Mn, Co, La, Ce, Y, or Sc at a rate of 5 wt % or less in total in the alloy may also be contained. The corrosion resistance of the rigid decorative coating can be further improved particularly by adding Cr.

Figure 2:
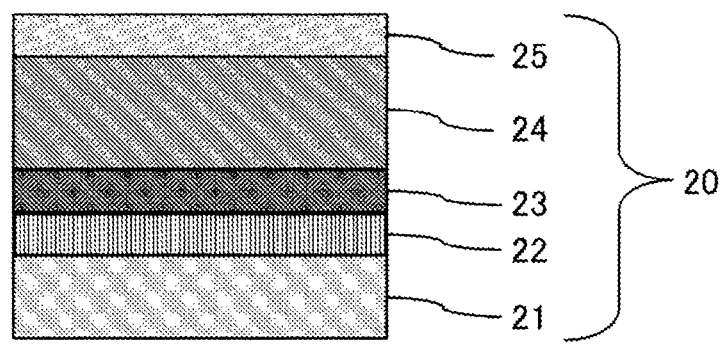
FIG. 2 illustrates one example of a cross-sectional schematic view of a golden rigid decorative member of a second embodiment of the present invention.

A second embodiment of the present invention is a golden rigid decorative member including a rigid decorative coating formed of four layers of an adhesion layer, a gradient adhesion layer, an abrasion-resistant layer, and a golden adjustment gradient layer. FIG. 2 illustrates a cross-sectional schematic view of the golden rigid decorative member of the second embodiment of the present invention. In the golden rigid decorative member of the present embodiment, a definite interface between an adhesion layer 22 and a gradient adhesion layer 23 is eliminated, and high adhesion to a base is secured. Further, the structure of the rigid decorative coating becomes a structure in which film stress is increased in a gradient manner is made, the effect of suppressing the generation of a crack due to stress strain and peeling is obtained, and therefore, scratch resistance and abrasion resistance are improved. Further, since an abrasion-resistant layer 24 having high film hardness can be thickly formed, further high scratch resistance performance is obtained.

Since the abrasion-resistant layer 24 of the golden rigid decorative member 20 includes a TiNb alloy nitride layer formed at a nitrogen content exhibiting the maximum hardness, the composite hardness of the whole rigid decorative member is increased, and high scratch resistance performance is obtained.

The appearance color of the golden rigid decorative member 20 is controlled by a golden adjustment gradient layer 25. Since the golden adjustment gradient layer 25 has a structure in which the content of the non-metallic element is increased or decreased in a gradient manner with departing from the abrasion-resistant layer 24, a color tone is increased or decreased in a gradient manner from the abrasion-resistant layer, recognition of a flaw is inhibited even if the flaw is generated, and a color sense with metallic luster and a high quality feel can be obtained.

(Adhesion Layer)

The adhesion layer 22 is a lower oxide film of an alloy of Ti and a metal selected from one or two of Nb, Ta, and V, and is selected depending on compatibility with a base material quality and an environment in which a coating is used. The adhesion layer 12 may contain a slight amount of nitrogen and carbon.

In addition to the metals, a metal such as Cr, Mo, W, Zr, Hf, B, Al, Si, Mn, Co, La, Ce, Y, or Sc at a rate of 5 wt % or less in total in the alloy may also be contained. The corrosion resistance of the golden rigid decorative member 20 can be further improved particularly by adding Cr.

The content of oxygen in the alloy metal lower oxide film of the adhesion layer is desirably 5 to 60 atm %, particularly preferably 5 to 45 atm %, with respect to the metals. The adhesion of the adhesion layer is not different from that of the alloy metal film when the oxygen content is less than 5 atm %, while the adhesion is deteriorated, and scratch resistance is also deteriorated when the oxygen content reaches 60 atm %.

The thickness of the adhesion layer of the alloy lower oxide film is desirably 0.03 to 0.3 μm. A thickness of 0.03 μm or more is needed for obtaining the effect of improving the adhesion by the adhesion layer; and, in addition, the adhesion effect is not increased very much even when the thickness is increased to more than 0.3 μm.

(Gradient Adhesion Layer)

The gradient adhesion layer 23 includes a film in which the content of non-metallic elements is increased in a gradient manner in a reaction compound of an alloy of Ti and a metal selected from one or two of Nb, Ta, and V, and of the non-metallic elements mainly including nitrogen and selected from carbon and oxygen. The gradient adhesion layer 23 preferably includes a film in which the content of admixture elements containing the non-metallic elements mainly including nitrogen and selected from carbon and oxygen is increased in a gradient manner, for example, a nitride film, a carbonitride film, a nitroxide film, an oxycarbonitride film, or the like. The kinds of materials to be selected are determined by compatibility with the adhesion layer 22 and the abrasion-resistant layer 24, and by an environment in which a coating is used.

In addition to the metals, a metal such as Cr, Mo, W, Zr, Hf, B, Al, Si, Mn, Co, La, Ce, Y, or Sc at a rate of 5 wt % or less in total in the alloy may also be contained. The corrosion resistance of the gradient adhesion layer 23 can be further improved particularly by adding Cr.

The gradient adhesion layer is a gradient film in which the whole content of the non-metallic elements further including one or two or more non-metallic elements mainly including nitrogen and selected from carbon and oxygen in the gradient adhesion layer is increased in a gradient manner from 0 to 50 atm % with respect to the alloy metal elements. The gradient adhesion layer preferably contains 5 to 25 atm % of oxygen. Furthermore, the gradient adhesion layer desirably has a structure in which the content of nitrogen, carbon, oxygen, or the admixture elements thereof is increased in a gradient manner in 0 to 50 atm %.

The thickness of the gradient adhesion layer is desirably 0.05 to 0.3 μm. In order to obtain the effect of the gradient adhesion layer, a thickness of 0.05 μm or more is needed; and, in addition, the adhesion effect is not increased very much even when the thickness is increased to more than 0.3 μm.

(Abrasion-Resistant Layer)

The abrasion-resistant layer 24 is formed of a reaction compound of an alloy of Ti and a metal selected from one or two of Nb, Ta, and V, and of a non-metallic element mainly including nitrogen, and including carbon or oxygen. The kinds of materials selected are determined depending on a demanded appearance color and an environment in which a coating is used.

In addition to the metals, a metal such as Cr, Mo, W, Zr, Hf, B, Al, Si, Mn, Co, La, Ce, Y, or Sc at a rate of 5 wt % or less in total in the alloy may also be contained. The corrosion resistance of the abrasion-resistant layer can be further improved particularly by adding Cr.

It is desirable that the content of the admixture elements mainly including nitrogen, and including carbon and/or oxygen in the abrasion-resistant layer is 5 to 70 atm %.

It is desirable that the thickness of the abrasion-resistant layer is 0.3 to 4 μm, and it is desirable that the hardness is HV2000 or more. Since the scratch resistance performance depends generally on the film thickness and film hardness of the abrasion-resistant layer, the film thickness and the film hardness are desirably allowed to be as high as possible. Since a thickness of the abrasion-resistant layer of 0.3 μm or less results in insufficient hardness while a thickness of more than 4 μm results in the higher risks of the generation of a crack and peeling due to the rise in film stress and also in a disadvantage in view of cost, the film thickness is desirably 4 μm or less.

(Golden Adjustment Gradient Layer)

The golden adjustment gradient layer 25 is formed by increasing or decreasing a non-metallic element in a gradient manner in a reaction compound of an alloy of Ti and a metal selected from one or two of Nb, Ta, and V, and of the non-metallic element mainly including nitrogen, and including carbon or oxygen. For example, the golden adjustment gradient layer 25 includes a nitride film, a carbonitride film, a nitroxide film, an oxycarbonitride film, or the like. The kinds of materials to be selected are determined by compatibility with the abrasion-resistant layer 24, by a demanded appearance color, and by an environment in which a coating is used.

In addition to the metals, a metal such as Cr, Mo, W, Zr, Hf, B, Al, Si, Mn, Co, La, Ce, Y, or Sc at a rate of 5 wt % or less in total in the alloy may also be contained. The corrosion resistance can be further improved particularly by adding Cr.

The golden adjustment gradient layer is a gradient film in which the content of the non-metallic elements of the golden adjustment gradient layer, preferably the admixture elements mainly including nitrogen, and including carbon and/or oxygen, increased or decreased in a gradient manner in a range of 70 to 15 atm % with respect to the alloy metal elements. In general, the increased rate of nitrogen in the non-metallic elements is preferred for obtaining a pale gold color with a high quality feel, and in addition to nitrogen, carbon and oxygen are added to thereby enable improvement in hardness. Further, even in the same gold tint, the tint can be changed from a pink tint to a brown tint by adjusting the amounts of nitrogen, carbon, and oxygen.

It is desirable that the thickness of the golden adjustment gradient layer is 0.05 to 0.3 μm. It is impossible to sufficiently recolor the abrasion-resistant layer when the thickness of the golden adjustment gradient layer is 0.05 μm or less. When the thickness of the golden adjustment gradient layer is 0.3 μm or more, scratch resistance is deteriorated since the thickness of the golden adjustment gradient layer having low hardness is increased, although the abrasion-resistant layer can also be sufficiently recolored.

For the brightness of the golden adjustment gradient layer, the sufficiently high brightness of the golden adjustment gradient layer is needed for determining the tint of the rigid decorative coating. $L^*$ which is a value exhibiting the brightness of the golden adjustment gradient layer in Lab color space displaying is desirably 78 or more for a tint with a high quality feel.

A third embodiment of the present invention is a golden rigid decorative member in which a rigid decorative coating is formed of two layers or three layers of the adhesion layer, the gradient adhesion layer, the abrasion-resistant layer, and the golden adjustment gradient layer. For example, various combinations such as a combination of formation of the adhesion layer on the substrate and direct formation of the golden adjustment gradient layer on the adhesion layer are possible.

(Production Method)

The method for producing a golden rigid decorative member of the present invention will be explained below.

Each stacked film included in the rigid decorative member of the present invention can be formed by a sputtering method, a CVD method, an ion plating method, or the like, and is preferably formed by a reactive sputtering method. In the present invention, an alloy compound coating such as a nitride film, a carbonitride film, a nitroxide film, or an oxycarbonitride film of an alloy is preferably formed by alloying atoms included in a target. Metals in the formed rigid decorative film can be allowed to have a uniform alloy structure by using the alloy target.

The reactive sputtering method is a method in which a high voltage with a direct current or an alternating current is applied between targets including atoms included in the base and the coating while introducing an inert gas (mainly an Ar gas) into a chamber evacuated to a vacuum, and ionized Ar is allowed to collide with the targets to form a thrown-up target substance on the base. A slight amount of reactive gas is introduced with the inert gas, whereby a compound coating of the atoms included in the targets and the reactive gas can be formed on the base. The adhesion, film hardness, and color tone of the decorative member 10 of the embodiment can be controlled by selecting the atoms included in the targets and the reactive gas and adjusting the amounts thereof.

The reactive sputtering method has high controllability of film quality and a film thickness, and is easily automated. Further, since sputtered atoms have high energy, the heating of the base for improving adhesion is not needed, and a film can be formed even on a base such as plastic having a low melting point. Further, because of the method in which the thrown-up target substance is formed on the base, film formation even with a high-melting-point material is possible, and a material is freely selected. Furthermore, a nitride film, a carbonitride film, a nitroxide film, an oxycarbonitride film, or the like can be easily formed by selecting or mixing reactive gases.

In the method for producing the golden rigid decorative member 20 of the second embodiment of the present invention illustrated in FIG. 2, the gradient adhesion layer 23 and the golden adjustment gradient layer 25 can be formed by chronologically increasing or decreasing the amount of a selected reactive gas. The amount of the reactive gas is controlled by an automatically controlled mass flow controller, and the color tones and hardnesses of the layers can be controlled by the amount of the reactive gas.

A golden rigid decorative member having such properties as mentioned above can be obtained by the above production method.

<Watch>

A watch provided by the present invention is characterized in that some of parts included in the watch, for example, exterior parts have the golden rigid decorative member mentioned above. The watch may be any of photovoltaic watches, thermo electric generating watches, standard time radio wave reception type self-correction watches, mechanical watches, and general electronic watches. Such a watch is produced by a known method using the golden rigid decorative member. The watch is an example of a decorative member that is easily flawed by friction with a shirt or by collision with a desk, a wall, or the like. The golden rigid decorative member of the present invention is formed into the watch, whereby a state in which a flaw is inhibited for many years and an appearance that is very beautiful can be maintained. For example, the rigid decorative member mentioned above can be used in the bezel, lug, case, crown, push button, band, and the like of the watch.

EXAMPLES

Example 1

Figure 3:
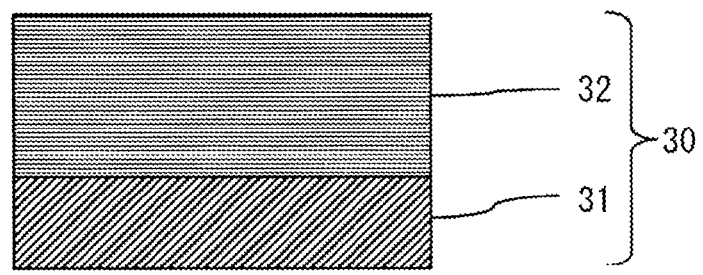
FIG. 3 illustrates a cross-sectional schematic view of a golden rigid decorative member of Example 1.

A sintered body with an alloy composition of 45 wt % Ti and 55 wt % Nb was used as a sputtering target. As illustrated in FIG. 3, an SUS316L material specified by JIS was used as a base 31, and a TiNb alloy nitride film 32 of 1.0 μm was formed on the base 31 by introducing 30 sccm of nitrogen gas into 105 sccm of argon gas by a sputtering method, to produce a golden rigid decorative member 30. The appearance color of the golden rigid decorative member 30 obtained thereby in Lab color space displaying exhibited L*: 83.15, a*: 1.07, and b*: 20.0, and the golden rigid decorative member 30 presented a pale gold color.

Figure 4:
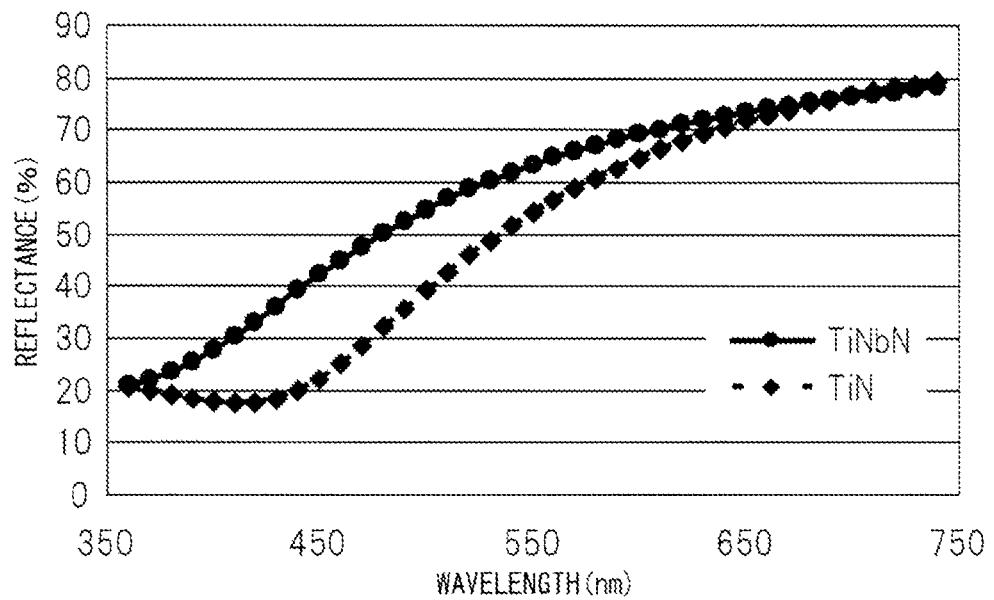
FIG. 4 represents the results of the measured reflectances of a golden rigid decorative member and a TiN film.

FIG. 4 represents a comparison of the reflectance properties of the TiNb alloy nitride film produced in Example 1 and the TiN film which is a common nitride presenting a gold color. It is found from FIG. 4 that the TiNb alloy nitride film produced in Example 1 has an obviously high reflectance and thus has high brightness.

Figure 5:
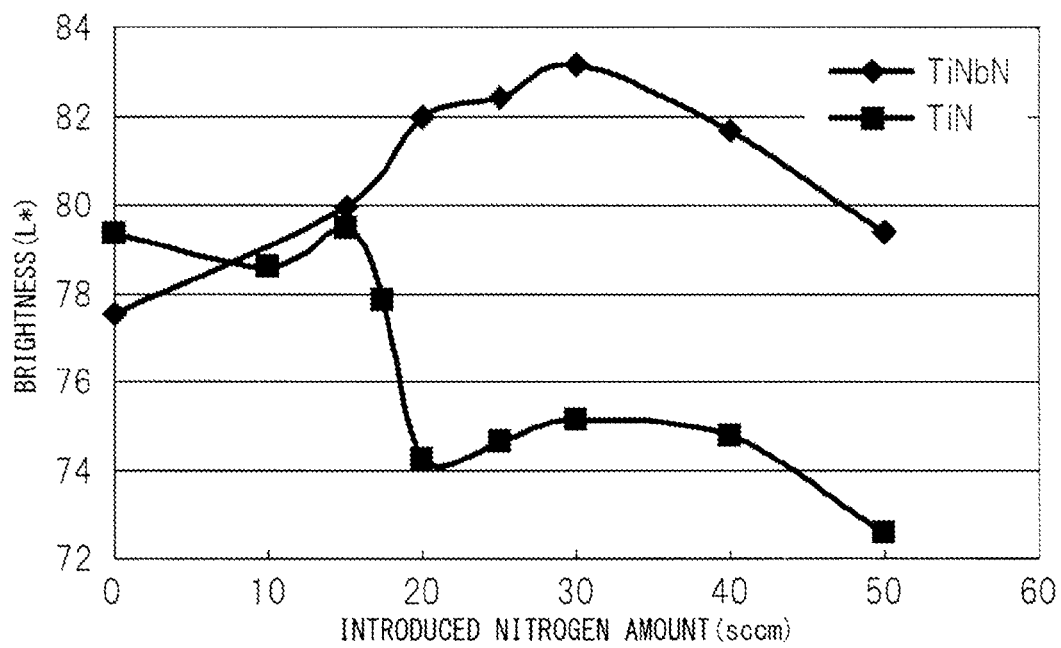
FIG. 5 represents a comparison of the brightnesses of a golden rigid decorative member and a TiN film, produced by changing the amount of a nitrogen gas.

FIG. 5 represents a comparison of the brightnesses of the films produced by changing the amount of nitrogen gas in the TiNb alloy nitride film and the TiN film. The brightness of the TiNb alloy nitride film is found to exhibit obviously high brightness compared to the TiN film when nitrogen is introduced to nitride the film.

Figure 6:
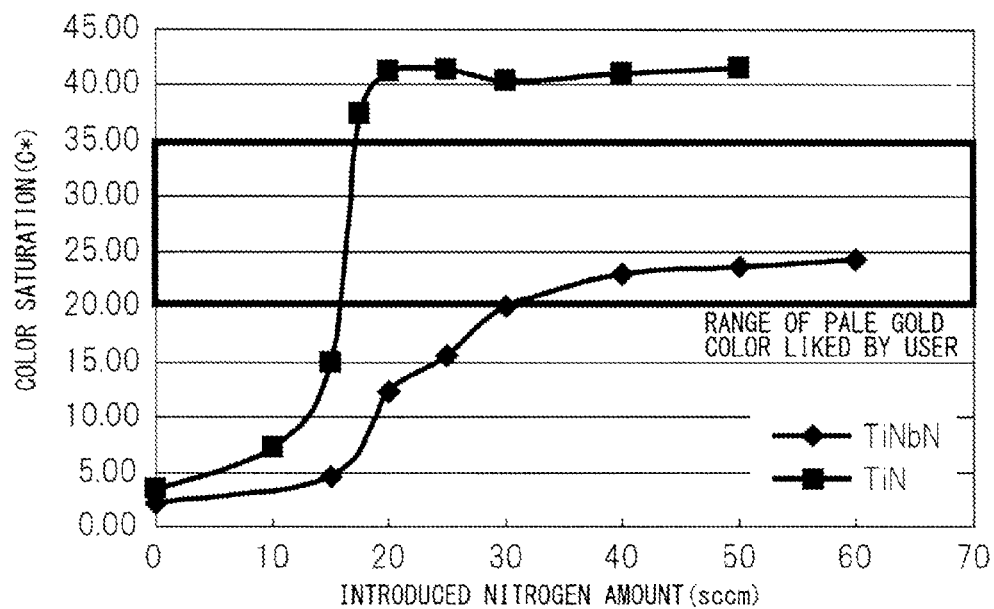
FIG. 6 represents a comparison of the color saturations of a golden rigid decorative member and a TiN film, produced by changing the amount of a nitrogen gas.

FIG. 6 represents a comparison of the color saturations of the films produced by changing the amount of nitrogen gas in the TiNb alloy nitride film and the TiN film. The TiNb alloy nitride film presents a stable, pale gold color with a color saturation of around 20 to 35, the color saturation is the color saturation of the pale golden color that is generally liked for exterior parts, and it is found that the same color saturation is stably exhibited in a range of the amount of nitrogen gas of 30 sccm or more. It is found that the TiNb alloy nitride film can be expected to be stably produced since in the case of the common TiN film, the range of the amount of nitrogen gas presenting the pale gold color is narrow, and it is difficult to obtain a stable, pale gold color.

Figure 7:
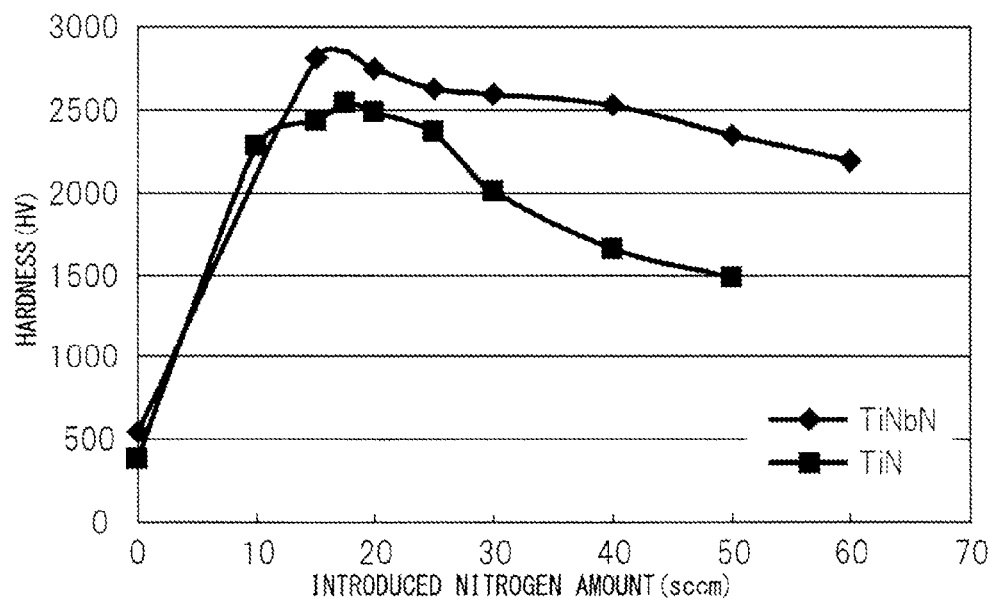
FIG. 7 represents a comparison of the hardnesses of a golden rigid decorative member and a TiN film, produced by changing the amount of a nitrogen gas.

FIG. 7 represents a comparison of the film hardnesses of the films produced by changing the amount of nitrogen gas in the TiNb alloy nitride film and the TiN film. It is found that the hardness of the TiNb alloy nitride film is higher than that of the TiN film by about HV500 or more in the range presenting a gold color. Since the scratch resistance performance is determined generally by the product of the hardness of the abrasion-resistant layer, the film thickness of the abrasion-resistant layer, the degree of adhesion to the base, and the hardness of the base, the high scratch resistance performance is obtained in the TiNb alloy nitride film, compared to the TiN film.

Figure 8:
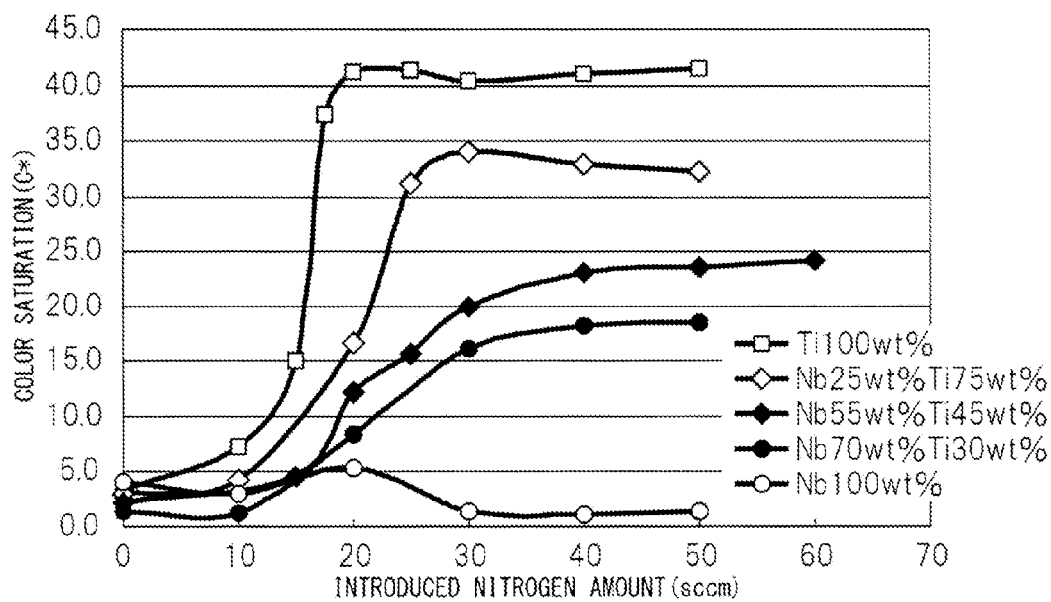
FIG. 8 represents the changes of the color saturations of NbTi alloy nitride films having different compositions.

FIG. 8 represents a comparison of the color saturations of TiNb alloy nitride films produced in different compositions. It is found from FIG. 8 that golden films exhibiting various color saturations can be freely produced at the alloy proportions of Ti and Nb and can be very stably produced at any compositions in production.

Figure 9:
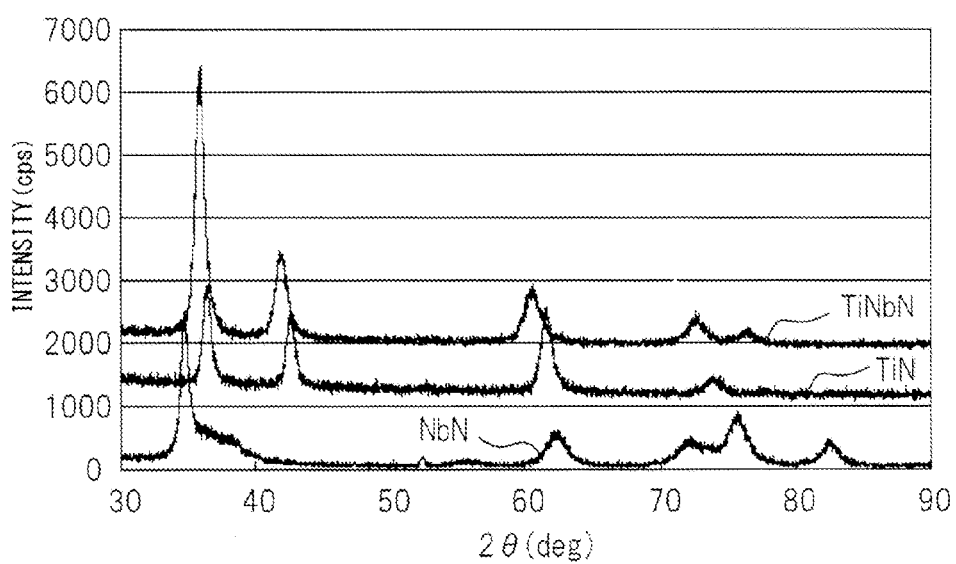
FIG. 9 represents the crystallinities of the golden rigid decorative member of the present invention, a TiN film, and a NbN film.

FIG. 9 represents a comparison of the crystallinities of the TiNb alloy nitride film produced in Example 1, and a TiN film and a NbN film. FIG. 9 reveals that the TiNb alloy nitride film exhibits a diffraction peak different from those of the TiN film and the NbN film, the difference of the crystallinities of the TiNb alloy nitride film, and the TiN film and the NbN film is due to formation of alloy crystals with a solid solution of Ti and Nb, and it is considered that the formation of the alloy crystals with the solid solution of Ti and Nb is one of the reasons of exhibiting higher brightness than that of each single film.

Example 2

Figure 10:
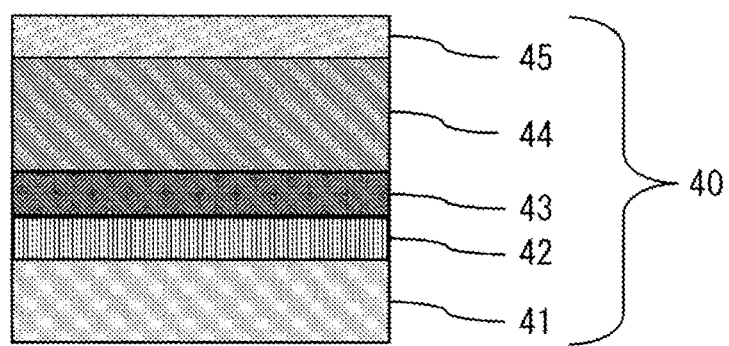
FIG. 10 illustrates a cross-sectional schematic view of a golden rigid decorative member of Example 2.

A sintered body with an alloy composition of 45 wt % Ti and 55 wt % Nb was used as a sputtering target. As illustrated in FIG. 10, an SUS316L material specified by JIS was used as a base 41, and an adhesion layer 42 of 0.1 μm including a lower oxide of a TiNb alloy was formed on the base 41 by a sputtering method. Thereafter, a nitrogen gas was increased in a gradient manner while introducing the minute amount of oxygen gas, whereby a gradient adhesion layer 43 with a TiNb alloy oxynitride film of 0.2 μm was formed. Thereafter, a thin-film abrasion-resistant layer 44 including a TiNb alloy nitride film of 1.5 μm was formed. Thereafter, a nitrogen gas was increased or decreased in a gradient manner, whereby a golden adjustment gradient layer 45 with the TiNb alloy nitride film of 0.1 μm was formed. The appearance color of the golden rigid decorative member 40 obtained in the present Example 2 in Lab color space displaying exhibited L*: 83.15, a*: 1.07, and b*: 20.0, and the TiNb alloy oxynitride film presented a pale gold color.

Since the golden rigid decorative member of Example 2 includes, on the base, the alloy adhesion layer having a high adhesion effect, the alloy gradient adhesion layer in which the content of nitrogen gas is increased in a gradient manner, the abrasion-resistant layer having high hardness, and the golden adjustment gradient layer in which the content of reactant gas is increased or decreased in a gradient manner, adhesion between the base and the film is significantly improved, and the abrasion-resistant layer having high film hardness can be thickly formed. A slight amount of oxygen is introduced into the adhesion layer and the alloy gradient adhesion layer, whereby adhesion between the substrate and the film can be strengthened by the crosslinking effect of the two hands of oxygen. Further, since the use of a structure formed by increasing the reactant gas in a gradient manner results in a structure in which film stress is gently increased from the substrate, peeling can be further suppressed, formation with a large film thickness is possible as a whole, and therefore, scratch resistance can be significantly improved.

A TiNb lower oxide film of 0.1 µm was formed as the adhesion layer 42 of the golden rigid decorative member 40 by introducing 5 sccm of oxygen gas under the condition of an introduced nitrogen gas amount of 0 sccm. The use of TiNb lower oxide for the adhesion layer 42 results in the higher adhesion to the base than that of the TiNb alloy film, enabling the improvement in scratch resistance. A TiNb alloy nitride film of 0.2 µm was formed as the gradient adhesion layer 43 by increasing, in a gradient manner, the amount of the introduced nitrogen gas from 0 sccm to 25 sccm while introducing 3 sccm of oxygen gas. A TiNb alloy nitride film of 1.5 µm was formed as the abrasion-resistant layer 44 under the condition of an introduced nitrogen gas amount of 25 sccm exhibiting the maximum hardness. A TiNb alloy nitride film of 0.1 µm was formed as the golden adjustment gradient layer 45 by increasing the amount of introduced nitrogen gas to 30 sccm, exhibiting the maximum brightness in FIG. 4, in a gradient manner.

The gradient adhesion layer 43 in the golden rigid decorative member 40 of Example 2 enables the integration of the base and the adhesion layer because of leading to the elimination of a definite interface between the adhesion layer and the abrasion-resistant layer. Since the gradient adhesion layer allows adhesion between the adhesion layer and the abrasion-resistant layer to be sufficiently secured, and the gradient adhesion layer 43 has a structure in which film stress is increased in a gradient manner, the effect of suppressing the generation of a crack and peeling due to stress strain is obtained, and the abrasion-resistant layer that is improved in scratch resistance and abrasion resistance and has high film hardness can be formed thickly. Since the scratch resistance is determined generally by the product of the hardness of the abrasion-resistant layer, the film thickness of the abrasion-resistant layer and the degree of adhesion to the base, the scratch resistance can be improved by improving the adhesion to the base.

In the golden adjustment gradient layer 45 in the golden rigid decorative member 40 of Example 2, the increase of the content of nitrogen in a gradient manner results in increase of L* in a gradient manner, in increased adhesion to the abrasion-resistant layer 44, and in inhibition of peeling even if flaws are generated, and also contributes to the effect of allowing flaws to be inconspicuous.

Figure 11:
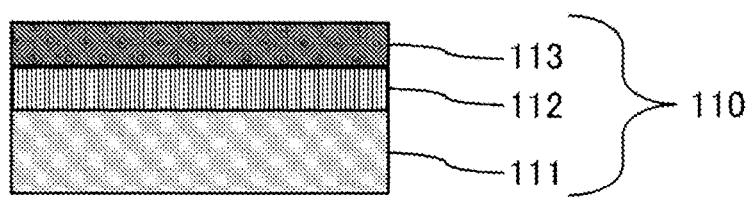
FIG. 11 illustrates a cross-sectional schematic view of a decorative member of a conventional example.
Figure 12:
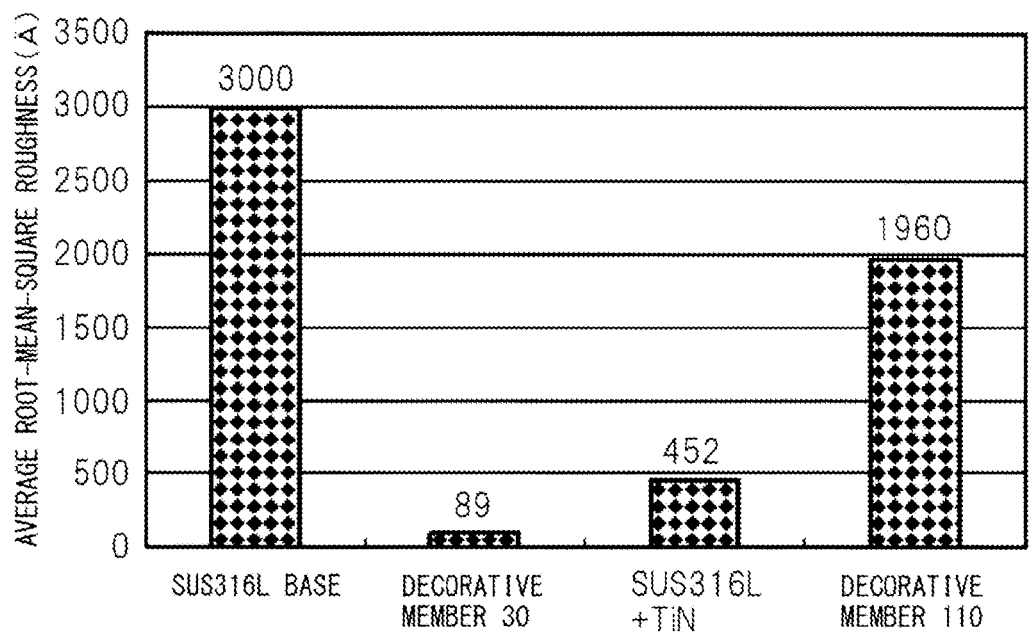
FIG. 12 represents the results of the measured scratch resistance performance of the golden rigid decorative member of Example 2.

FIG. 12 represents the results of measuring the scratch resistance performance in the golden rigid decorative member 40 of Example 2. In the figure, the results of measuring the scratch resistances (average root-mean-square roughnesses) of a decorative member 110 illustrated in FIG. 11 and produced based on Patent Literature 1, the golden rigid decorative member 40 of Example 2 according to the present invention, an SUS316L base on which no rigid film is formed, and a member in which a TiN film of 1.0 µm is formed on SUS316L as comparisons are represented. It was confirmed from FIG. 12 that the golden rigid decorative member 40 of Example 2 of the present invention had far better scratch resistance performance than those of the SUS316L base on which no rigid film was formed and the decorative member 110 produced based on Patent Literature 1.

Since the scratch resistance performance is determined generally by the product of the hardness of the abrasion-resistant layer, the film thickness of the abrasion-resistant layer, the degree of adhesion to the base, and the hardness of the base, the TiN film produced as the comparison was also wanted to be formed to have a film thickness of 1.8 µm or more; however, since a crack and peeling were observed in the film with a film thickness of 1.1 µm or more when the TiN film was formed on the substrate without being processed, the film thickness was allowed to be 1.0 µm.

Example 3

Figure 13:
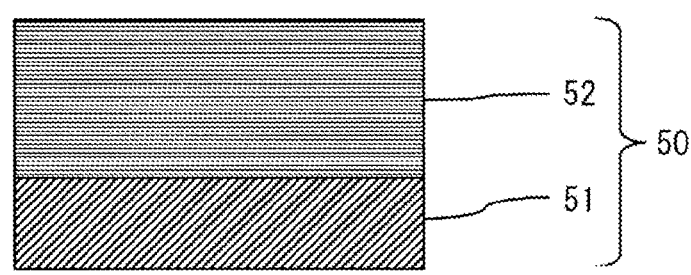
FIG. 13 illustrates a cross-sectional schematic view of a golden rigid decorative member of Example 3.

A sintered body with an alloy composition of 50 wt % Ti and 50 wt % Ta was used as a sputtering target. As illustrated in FIG. 13, an SUS316L material specified by JIS was used as a base 51, and a TiTa alloy nitride film 52 of 1.0 µm was formed on the base 51 by introducing 35 sccm of nitrogen gas into 105 sccm of argon gas by a sputtering method, to produce a golden rigid decorative member 50. The appearance color of the golden rigid decorative member 50 obtained in the present Example 3 in Lab color space displaying exhibited L*: 82.0, a*: 1.82, and b*: 22.84, and the TiTa alloy nitride film 52 presented a pale gold color.

Figure 14:
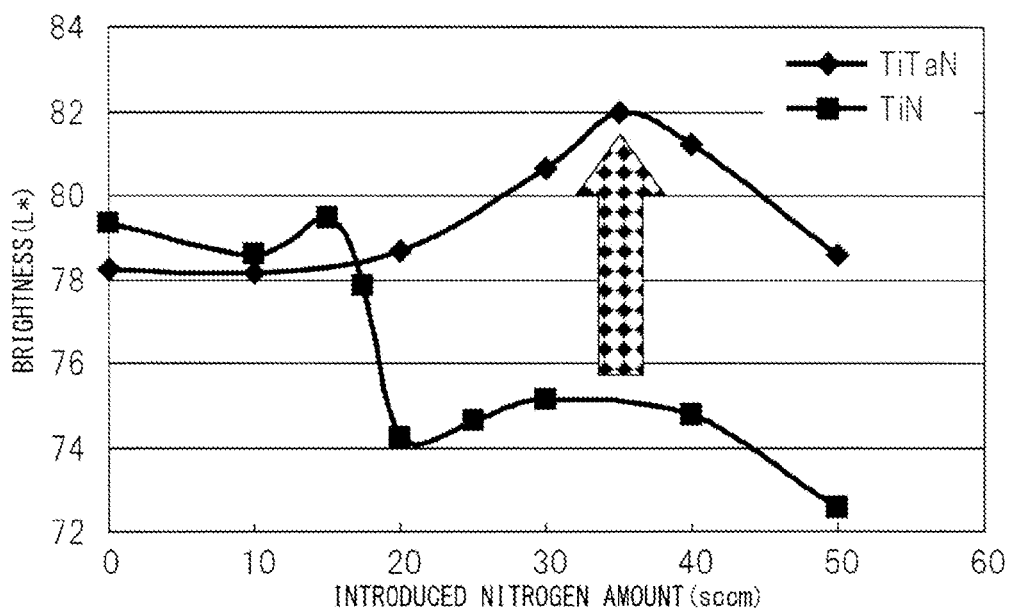
FIG. 14 represents a comparison of the brightnesses of a TiTa alloy nitride film and a TiN film, produced by changing the amount of a nitrogen gas.

FIG. 14 represents a comparison of the brightnesses of the films produced by changing the amount of nitrogen gas in the TiTa alloy nitride film and the TiN film. The brightness of the TiTa alloy nitride film is found to exhibit obviously high brightness compared to the TiN film when nitrogen is introduced to nitride the film.

Figure 15:
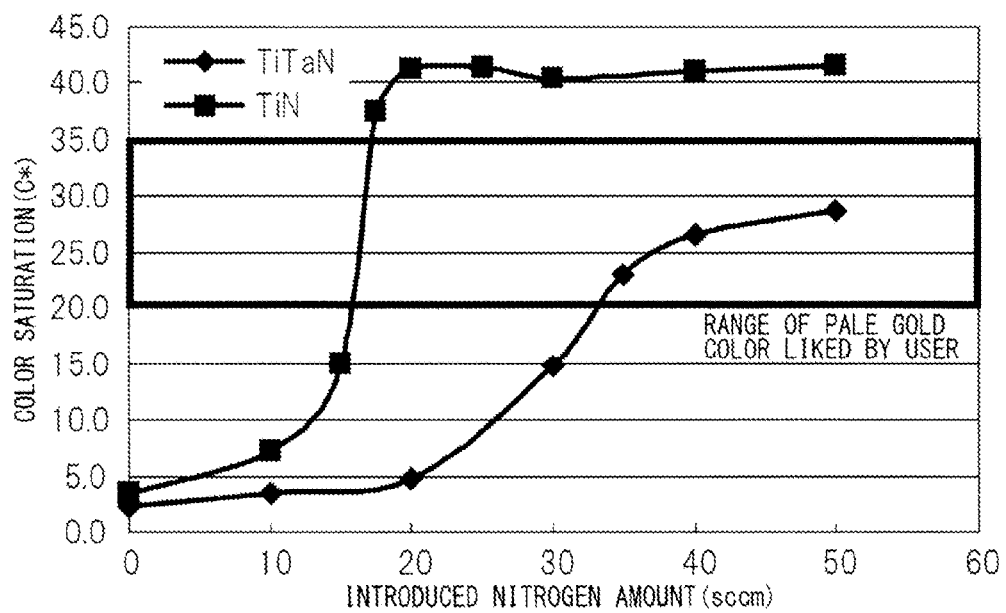
FIG. 15 represents a comparison of the color saturations of a TiTa alloy nitride film and a TiN film, produced by changing the amount of a nitrogen gas.

FIG. 15 represents a comparison of the color saturations of the films produced by changing the amount of nitrogen gas in the TiTa alloy nitride film and the TiN film. The TiTa alloy nitride film presents a stable, pale gold color with a color saturation of around 20 to 35, the color saturation is the color saturation of the pale golden color that is generally liked for exterior parts, and it is found that the same color saturation is stably exhibited in a range of 35 sccm or more. It is found that the TiTa alloy nitride film can be expected to be stably produced since in the case of the common TiN film, the range of the amount of nitrogen gas presenting the pale gold color is narrow, and it is difficult to obtain a stable, pale gold color.

Figure 16:
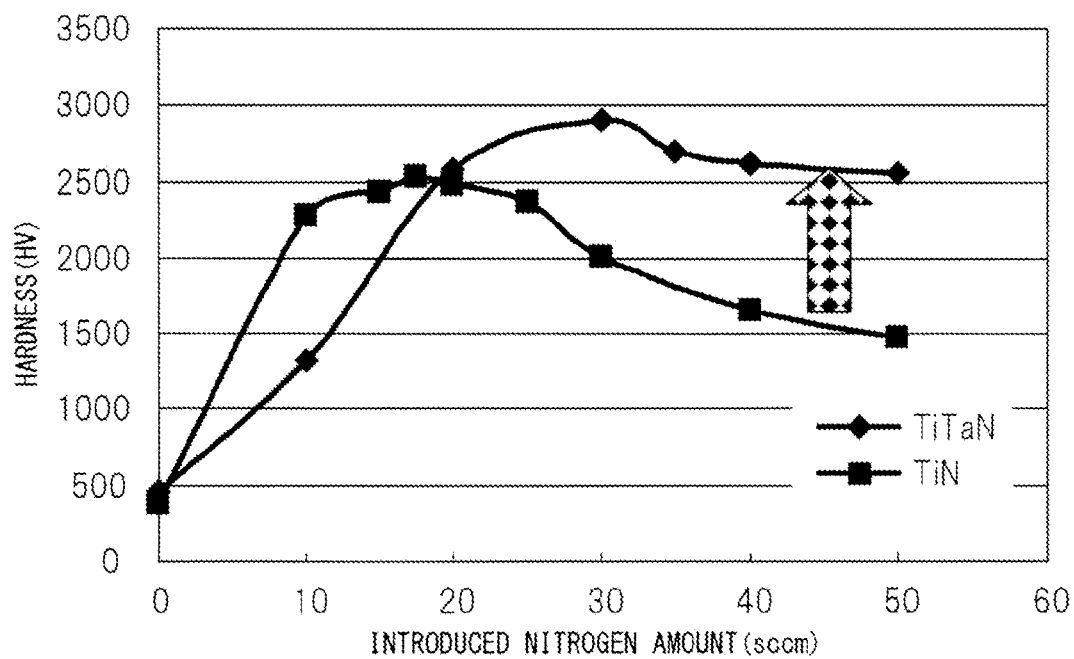
FIG. 16 represents a comparison of the hardnesses of a TiTa alloy nitride film and a TiN film, produced by changing the amount of a nitrogen gas.

FIG. 16 represents a comparison of the film hardnesses of the films produced by changing the amount of nitrogen gas in the TiTa alloy nitride film and the TiN film. It is found that the hardness of the TiTa alloy nitride film is higher than that of the TiN film by about HV500 or more in the range presenting a gold color. Since the scratch resistance performance is determined generally by the product of the hardness of the abrasion-resistant layer, the film thickness of the abrasion-resistant layer, the degree of adhesion to the base, and the hardness of the base, the TiTa alloy nitride film has high scratch resistance performance compared to the TiN film.

In Table 1, the brightnesses, color saturations, and hardnesses of TiTa alloy nitrocarbide films produced by introducing 10, 20, and 30 sccm of methane gas into a TiTa alloy film under constant conditions of 105 sccm of Ar gas and 40 sccm of nitrogen gas are listed. It is found from Table 1 that the color tone is changed from a pale gold color to a pink color, and to a brown color with increasing the amount of methane gas, and higher hardness than that of a TiTa alloy nitride film is exhibited under a certain condition of the amount of introduced methane.

TABLE 1

| Argon | Nitrogen | Methane | L* | a* | b* | C* | HV |
|---|---|---|---|---|---|---|---|
| 105 | 40 | 0 | 81.23 | 2.42 | 26.51 | 26.6 | 2620.23 |
| 105 | 40 | 10 | 71.82 | 8.97 | 23.86 | 25.5 | 2959.73 |
| 105 | 40 | 20 | 68.22 | 9.67 | 18.64 | 21.0 | 2754.41 |
| 105 | 40 | 30 | 65.79 | 9.19 | 14.97 | 17.6 | 2378.79 |

Example 4

Figure 17:
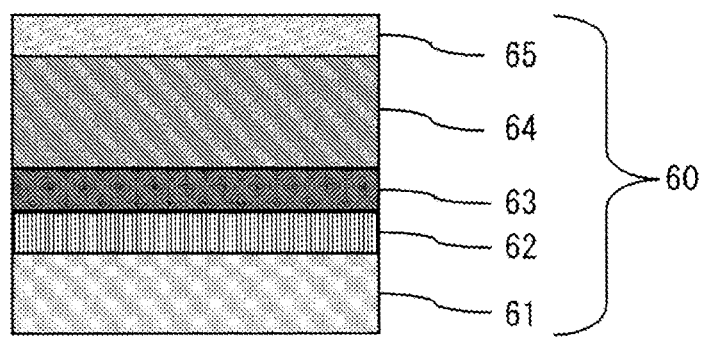
FIG. 17 illustrates a cross-sectional schematic view of a golden rigid decorative member of Example 4.

A sintered body with an alloy composition of 50 wt % Ti and 50 wt % Ta was used as a sputtering target. As illustrated in FIG. 17, an SUS316L material specified by JIS was used as a base 61, and an adhesion layer 62 of 0.1 µm including a lower oxide of a TiTa alloy was formed on the base 61 by a sputtering method. Thereafter, a nitrogen gas was increased in a gradient manner while introducing the minute amount of oxygen gas, whereby a gradient adhesion layer 63 with a TiTa alloy oxynitride film of 0.2 µm was formed. Thereafter, a thin-film abrasion-resistant layer 64 including a TiTa alloy nitride film of 1.5 µm was formed. Thereafter, a nitrogen gas was increased or decreased in a gradient manner, whereby a golden adjustment gradient layer 65 with the TiTa alloy nitride film of 0.1 µm was formed.

The appearance color of the golden rigid decorative member 60 obtained in the present Example 4 in Lab color space displaying exhibited L*: 82.0, a*: 1.82, and b*: 22.84, and the TiTa alloy nitride film presented a pale gold color.

Since the golden rigid decorative member of Example 4 includes, on the base, the alloy adhesion layer having a high adhesion effect, the alloy gradient adhesion layer in which the content of nitrogen gas is increased in a gradient manner, the abrasion-resistant layer having high hardness, and the golden adjustment gradient layer in which the content of reactant gas is increased or decreased in a gradient manner, adhesion between the base and the film is significantly improved, and the abrasion-resistant layer having high film hardness can be thickly formed. A slight amount of oxygen is introduced into the adhesion layer and the alloy gradient adhesion layer, whereby adhesion between the substrate and the film can be strengthened by the crosslinking effect of the two hands of oxygen. Further, since the use of a structure formed by increasing the reactant gas in a gradient manner results in a structure in which film stress is gently increased from the substrate, peeling can be further suppressed, formation with a large film thickness is possible as a whole, and therefore, scratch resistance can be significantly improved.

A TiTa lower oxide film of 0.1 µm was formed as the adhesion layer 62 of the golden rigid decorative member 60 of Example 4 by introducing 5 sccm of oxygen gas under the condition of an introduced nitrogen gas amount of 0 sccm. The use of TiTa lower oxide for the adhesion layer 62 results in the higher adhesion to the base than that of the TiTa alloy film, enabling the improvement in scratch resistance. A TiTa alloy nitride film of 0.2 µm was formed as the gradient adhesion layer 63 by increasing, in a gradient manner, the amount of the introduced nitrogen gas from 0 sccm to 30 sccm while introducing 3 sccm of oxygen gas. A TiTa alloy nitride film of 1.5 µm was formed as the abrasion-resistant layer 64 under the condition of an introduced nitrogen gas amount of 30 sccm exhibiting the maximum hardness. A TiTa alloy nitride film of 0.2 µm was formed as the golden adjustment gradient layer 65 by increasing the amount of introduced nitrogen gas to 35 sccm, exhibiting the maximum brightness in FIG. 14, in a gradient manner.

The gradient adhesion layer 63 in the golden rigid decorative member 60 of Example 4 enables the integration of the base and the adhesion layer because of leading to the elimination of a definite interface between the adhesion layer and the abrasion-resistant layer. Since the presence of the gradient adhesion layer allows adhesion between the adhesion layer and the abrasion-resistant layer to be sufficiently secured, and a structure in which film stress is increased in a gradient manner is made, the effect of suppressing the generation of a crack and peeling due to stress strain is obtained, and the abrasion-resistant layer that is improved in scratch resistance and abrasion resistance and has high film hardness can be formed thickly. Since the scratch resistance is determined generally by the product of the hardness of the abrasion-resistant layer, the film thickness of the abrasion-resistant layer, and the degree of adhesion to the base, the scratch resistance can be improved by improving the adhesion to the base.

In the golden adjustment gradient layer 65 in the golden rigid decorative member 60 of Example 4, the increase of the content of nitrogen in a gradient manner results in increase of L* in a gradient manner, in increased adhesion to the abrasion-resistant layer 64, and in inhibition of peeling even if flaws are generated, and also contributes to the effect of allowing flaws to be inconspicuous.

Figure 18:
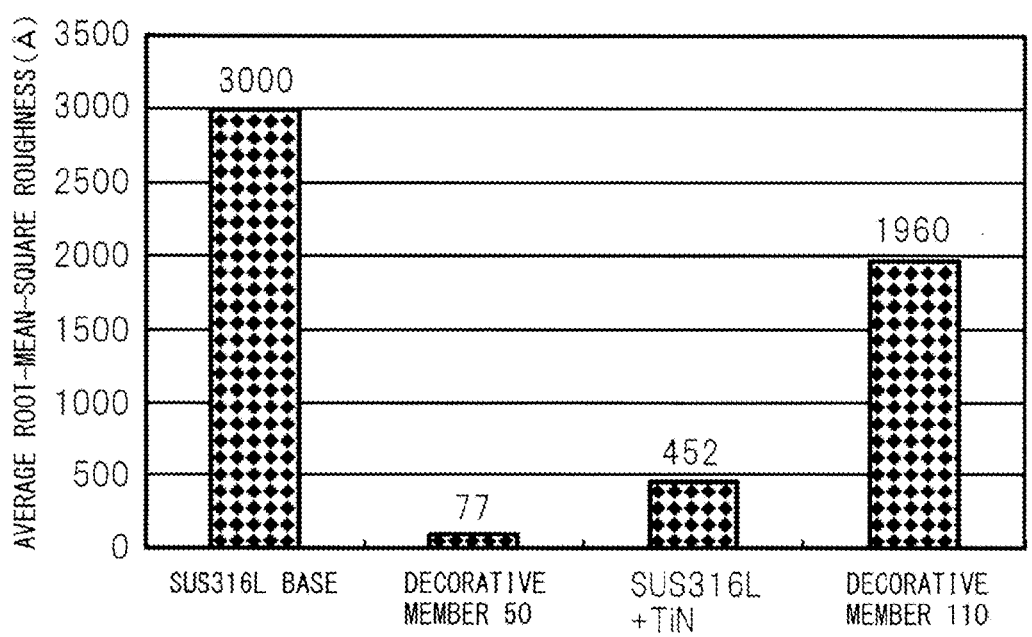
FIG. 18 represents the results of the measured scratch resistance performance of the golden rigid decorative member of Example 4.

FIG. 18 represents the results of measuring the scratch resistance performance in the golden rigid decorative member 60 of Example 4. In the figure, the results of measuring the scratch resistances (average root-mean-square roughnesses) of the decorative member 110 of a conventional example (produced based on Patent Literature 1) illustrated in FIG. 11, the golden rigid decorative member 60 of Example 4 according to the present invention, an SUS316L base on which no rigid film is formed, and a member in which a TiN film of 1.0 µm is formed on SUS316L as comparisons are represented. It was confirmed from FIG. 18 that the golden rigid decorative member 60 of Example 4 of the present invention had far better scratch resistance performance than those of the SUS316L base on which no rigid film was formed and the decorative member 110 produced based on Patent Literature 1.

The scratch resistance performance is determined generally by the product of the hardness of the abrasion-resistant layer, the film thickness of the abrasion-resistant layer, the degree of adhesion to the base, and the hardness of the base. The TiN film produced as the comparison was also wanted to be formed to have a film thickness of 1.8 µm or more; however, since a crack and peeling were observed in the film with a film thickness of 1.1 µm or more when the TiN film was formed on the substrate without being processed, the film thickness was allowed to be 1.0 µm.

Example 5

Figure 19:
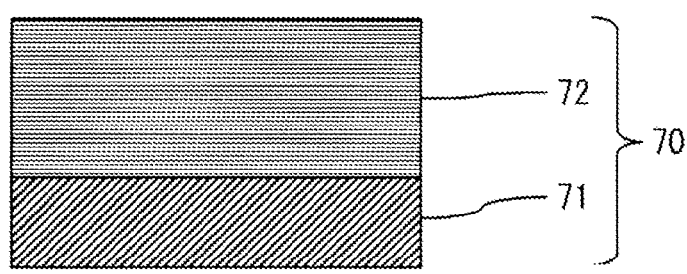
FIG. 19 illustrates a cross-sectional schematic view of a golden rigid decorative member of Example 5.

A sintered body with an alloy composition of 50 wt % Ti, 40 wt % Nb, and 10 wt % V was used as a sputtering target. As illustrated in FIG. 19, an SUS316L material specified by JIS was used as a base 71, and a TiNbV alloy nitride film of 1.0 µm was formed on the base 71 by introducing 30 sccm of nitrogen gas into 105 sccm of argon gas by a sputtering method, to produce a golden rigid decorative member 70. The appearance color of the golden rigid decorative member 70 obtained in the present Example 5 in Lab color space displaying exhibited L*: 82.4, a*: 1.62, and b*: 21.75, and the TiNbV alloy nitride film presented a pale gold color.

Figure 20:
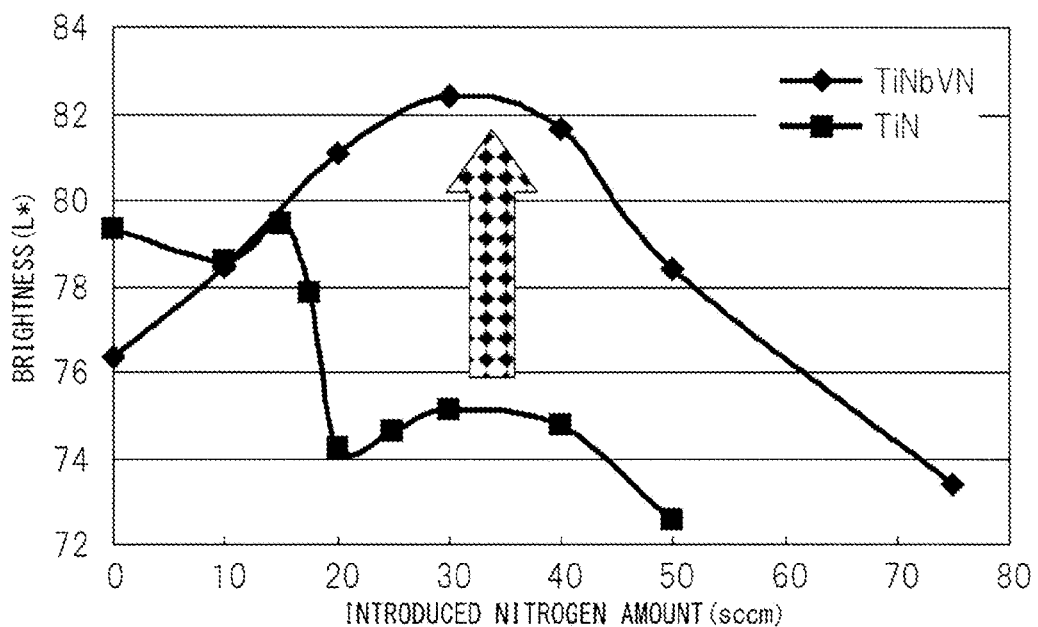
FIG. 20 represents a comparison of the brightnesses of a golden rigid decorative member and a TiN film, produced by changing the amount of a nitrogen gas.

FIG. 20 represents a comparison of the brightnesses of the films produced by changing the amount of nitrogen gas in the TiNbV alloy nitride film and the TiN film. The TiNbV alloy nitride film is found to exhibit obviously high brightness compared to the TiN film nitrided by introducing nitrogen.

Figure 21:
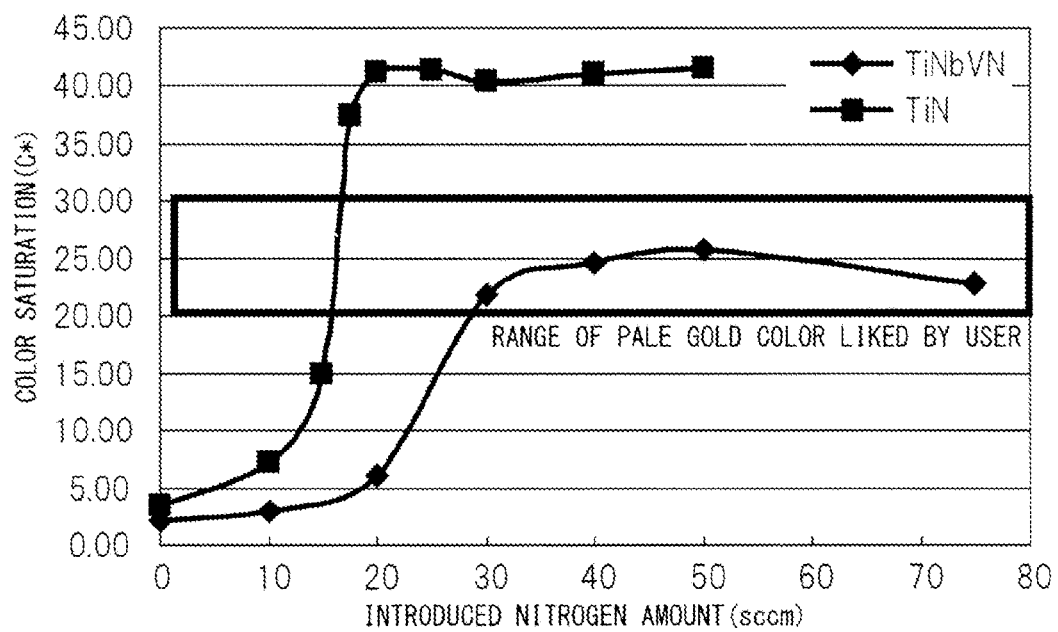
FIG. 21 represents a comparison of the color saturations of a golden rigid decorative member and a TiN film, produced by changing the amount of a nitrogen gas.

FIG. 21 represents a comparison of the color saturations of the films produced by changing the amount of nitrogen gas in the TiNbV alloy nitride film and the TiN film. The TiNbV alloy nitride film presents a stable, pale gold color with a color saturation of around 20 to 35, the color saturation is the color saturation of the pale golden color that is generally liked for exterior parts, and it is found that the same color saturation is stably exhibited in a range of 30 sccm or more. It is found that the TiNbV alloy nitride film can be expected to be stably produced since in the case of the common TiN film, the range of the amount of nitrogen gas presenting the pale gold color is narrow, and it is difficult to obtain a stable, pale gold color.

Figure 22:
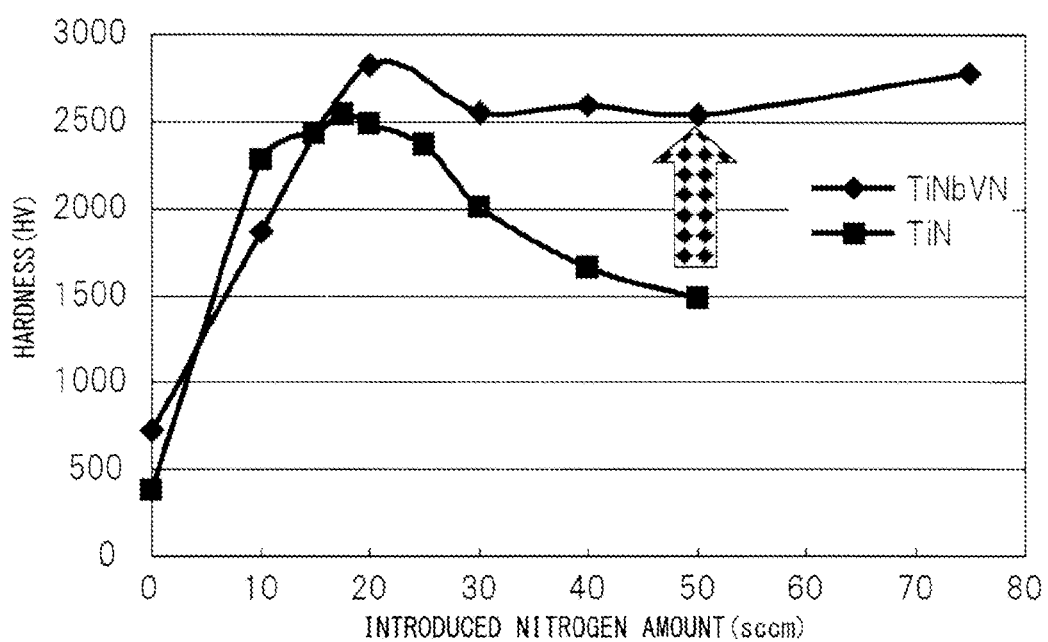
FIG. 22 represents a comparison of the hardnesses of a golden rigid decorative member and a TiN film, produced by changing the amount of a nitrogen gas.

FIG. 22 represents a comparison of the film hardnesses of the films produced by changing the amount of nitrogen gas in the TiNbV alloy nitride film and the TiN film. It is found that the hardness of the TiNbV alloy nitride film is higher than that of the TiN film by about HV600 or more in the range presenting a gold color. Since the scratch resistance performance is determined generally by the product of the hardness of the abrasion-resistant layer, the film thickness of the abrasion-resistant layer, the degree of adhesion to the base, and the hardness of the base, the TiNbV alloy nitride film has high scratch resistance performance compared to the TiN film.

In Table 2, the brightnesses, color saturations, and hardnesses of TiNbV alloy oxynitride films produced by introducing 5, 10, and 20 sccm of oxygen gas into a TiNbV alloy film under constant conditions of 105 sccm of Ar gas and 40 sccm of nitrogen gas are listed. It is found from Table 2 that the color tone is changed from a pale gold color to a pink color, and to a dark brown color, and higher hardness than that of a TiNbV alloy nitride film is exhibited under a certain condition of the amount of introduced oxygen.

TABLE 2

| Argon | Nitrogen | Methane | L* | a* | b* | C* | HV |
|---|---|---|---|---|---|---|---|
| 105 | 40 | 0 | 82.4 | 1.62 | 21.75 | 21.81 | 2595 |
| 105 | 40 | 5 | 78.22 | 7.23 | 20.84 | 22.06 | 2659 |
| 105 | 40 | 10 | 68.42 | 5.23 | 20.11 | 20.78 | 2691 |
| 105 | 40 | 20 | 55.24 | 5.65 | 4.17 | 7.02 | 2377 |

Example 6

Figure 23:
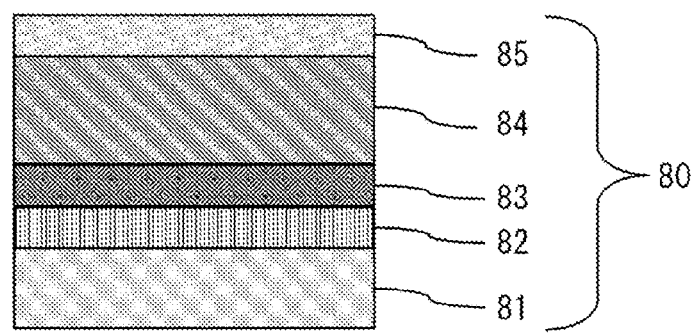
FIG. 23 illustrates a cross-sectional schematic view of a golden rigid decorative member of Example 6.

A sintered body with an alloy composition of 50 wt % Ti, 40 wt % Nb, and 10 wt % V was used as a sputtering target. As illustrated in FIG. 23, an SUS316L material specified by JIS was used as a base 81, and an adhesion layer 82 of 0.1 µm including a lower oxide of a TiNbV alloy was formed on the base 81 by a sputtering method. Thereafter, a nitrogen gas was increased in a gradient manner while introducing the minute amount of oxygen gas, whereby a gradient adhesion layer 83 with a TiNbV alloy oxynitride film of 0.2 µm was formed. Thereafter, a thin-film abrasion-resistant layer 84 including a TiNbV alloy nitride film of 1.5 µm was formed. Thereafter, a nitrogen gas was increased or decreased in a gradient manner, whereby a golden adjustment gradient layer 85 with the TiNbV alloy nitride film of 0.1 µm was formed. The appearance color of the golden rigid decorative member 80 obtained in the present Example 6 in Lab color space displaying exhibited L*: 82.4, a*: 1.62, and b*: 21.75, and the TiNbV alloy nitride film presented a pale gold color.

Since the golden rigid decorative member of Example 6 includes, on the base, the alloy adhesion layer having a high adhesion effect, the alloy gradient adhesion layer in which the content of nitrogen gas is increased in a gradient manner, the abrasion-resistant layer having high hardness, and the golden adjustment gradient layer in which the content of reactant gas is increased or decreased in a gradient manner, adhesion between the base and the film is significantly improved, and the abrasion-resistant layer having high film hardness can be thickly formed. A slight amount of oxygen is introduced into the adhesion layer and the alloy gradient adhesion layer, whereby adhesion between the substrate and the film can be strengthened by the crosslinking effect of the two hands of oxygen. Further, since the use of a structure formed by increasing the reactant gas in a gradient manner results in a structure in which film stress is gently increased from the substrate, peeling can be further suppressed, formation with a large film thickness is possible as a whole, and therefore, scratch resistance can be significantly improved.

A TiNbV lower oxide film of 0.1 µm was formed as the adhesion layer 82 of the golden rigid decorative member 80 of Example 6 by introducing 5 sccm of oxygen gas under the condition of an introduced nitrogen gas amount of 0 sccm. The use of TiNbV lower oxide for the adhesion layer 82 results in the higher adhesion to the base than that of the TiNbV alloy film, enabling the improvement in scratch resistance. A TiNbV alloy nitride film of 0.2 µm was formed as the gradient adhesion layer 83 by increasing, in a gradient manner, the amount of the introduced nitrogen gas from 0 sccm to 20 sccm while introducing 3 sccm of oxygen gas. A TiNbV alloy nitride film of 1.5 µm was formed as the abrasion-resistant layer 84 under the condition of an introduced nitrogen gas amount of 20 sccm exhibiting the maximum hardness. A TiNbV alloy nitride film of 0.1 µm was formed as the golden adjustment gradient layer 85 by increasing the amount of introduced nitrogen gas to 30 sccm, exhibiting the maximum brightness in FIG. 20, in a gradient manner.

The gradient adhesion layer 83 in the golden rigid decorative member 80 of Example 6 enables the integration of the base and the adhesion layer because of leading to the elimination of a definite interface between the adhesion layer and the abrasion-resistant layer. Since the presence of the gradient adhesion layer allows adhesion between the adhesion layer and the abrasion-resistant layer to be sufficiently secured, and a structure in which film stress is increased in a gradient manner is made, the effect of suppressing the generation of a crack and peeling due to stress strain is obtained, and the abrasion-resistant layer that is improved in scratch resistance and abrasion resistance and has high film hardness can be formed thickly. Since the scratch resistance is determined generally by the product of the hardness of the abrasion-resistant layer, the film thickness of the abrasion-resistant layer and the degree of adhesion to the base, the scratch resistance can be improved by improving the adhesion to the base.

In the golden adjustment gradient layer 85 in the golden rigid decorative member 80 of Example 6, the increase of the content of nitrogen in a gradient manner results in increase of L* in a gradient manner, in increased adhesion to the abrasion-resistant layer 84, and in inhibition of peeling even if flaws are generated, and also contributes to the effect of allowing flaws to be inconspicuous.

Figure 24:
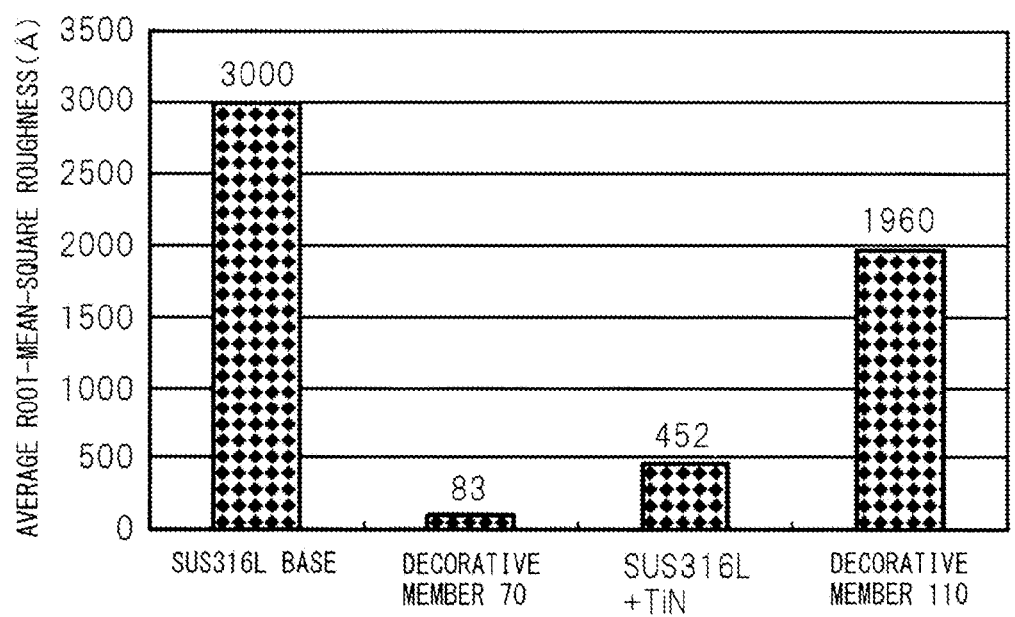
FIG. 24 represents the results of the measured scratch resistance performance of the golden rigid decorative member of Example 6.

FIG. 24 represents the results of measuring the scratch resistance performance in the golden rigid decorative member 80 of Example 6. There are the results of measuring the scratch resistances (average root-mean-square roughnesses) of the decorative member 110 illustrated in FIG. 11 and produced based on Patent Literature 1, the golden rigid decorative member 80 of Example 6 according to the present invention, an SUS316L base on which no rigid film is formed, and a member in which a TiN film of 1.0 μm is formed on SUS316L as comparisons. It was confirmed from FIG. 24 that the golden rigid decorative member 80 of Example 6 of the present invention had far better scratch resistance performance than those of the SUS316L base on which no rigid film was formed and the decorative member 110 produced based on Patent Literature 1.

The scratch resistance performance is determined generally by the product of the hardness of the abrasion-resistant layer, the film thickness of the abrasion-resistant layer, the degree of adhesion to the base, and the hardness of the base. The TiN film produced as the comparison was also wanted to be formed to have a film thickness of 1.8 μm or more; however, since a crack and peeling were observed in the film with a film thickness of 1.1 μm or more when the TiN film was formed on the substrate without being processed, the film thickness was allowed to be 1.0 μm.

INDUSTRIAL APPLICABILITY

Since the present invention can provide a golden rigid decorative member in which deterioration of appearance quality due to a flaw, abrasion, or the like is suppressed, and which has a pale color tone having a color tone with a high quality feel, the present invention can be utilized in decorative members for exterior parts of watches, personal ornaments such as glasses and accessories, decorative trims, sporting goods, and the like. Further, there can be provided a method capable of stably producing the golden rigid decorative member can be provided, and therefore, industrial applicability is high.

REFERENCE SIGNS LIST

10 Golden rigid decorative member
11 Base
12 Abrasion-resistant layer
110 Golden rigid decorative member
111 Base
112 Abrasion-resistant layer
113 Finishing layer
20 Golden rigid decorative member
21 Base
22 Adhesion layer
23 Gradient adhesion layer
24 Abrasion-resistant layer
25 Golden adjustment gradient layer
30 Golden rigid decorative member
31 Base
32 Abrasion-resistant layer
40 Golden rigid decorative member
41 Base
42 Adhesion layer
43 Gradient adhesion layer
44 Abrasion-resistant layer
45 Golden adjustment gradient layer
50 Golden rigid decorative member
51 Base
52 Abrasion-resistant layer
60 Golden rigid decorative member
61 Base
62 Adhesion layer
63 Gradient adhesion layer
64 Abrasion-resistant layer
65 Golden adjustment gradient layer
70 Golden rigid decorative member
71 Base
72 Abrasion-resistant layer
80 Golden rigid decorative member
81 Base
82 Adhesion layer
83 Gradient adhesion layer
84 Abrasion-resistant layer
85 Golden adjustment gradient layer

The invention claimed is:

1. A rigid decorative member comprising:
a base; and
a rigid decorative coating with plural layers containing a reaction compound of an alloy of Ti and one or two or more metals selected from Nb, Ta, and V, and of one or two or more non-metallic elements selected from nitrogen, oxygen, and carbon on the base, wherein
the plural layers include an adhesion layer stacked on a substrate, a gradient adhesion layer stacked on the adhesion layer, an abrasion-resistant layer stacked on the gradient adhesion layer, and a golden adjustment gradient layer stacked on the abrasion-resistant layer;
a non-metallic element in the adhesion layer is low-concentration oxygen;
a non-metallic element in the gradient adhesion layer, that of the abrasion-resistant layer, and that of the golden adjustment gradient layer mainly comprise nitrogen and are selectively selected from carbon and oxygen;
the content of a non-metallic element in a reaction compound included in the gradient adhesion layer is increased in a gradient manner in a thickness direction with departing from the substrate; and
the content of a non-metallic element in a reaction compound included in the golden adjustment gradient layer is increased or decreased in a gradient manner in a thickness direction with departing from the substrate.

2. The rigid decorative member according to claim 1, wherein the non-metallic element in the coating mainly comprises nitrogen.

3. The rigid decorative member according to claim 1, wherein the alloy proportion of the Ti is 25 wt % or more.

4. The rigid decorative member according to claim 1, wherein the appearance color of the golden adjustment gradient layer is a pale gold color.

5. The rigid decorative member according to claim 1, wherein the thickness of the abrasion-resistant layer is 0.5 to 4 μm.

6. The rigid decorative member according to claim 1, wherein a value of L*, exhibiting brightness in Lab color space displaying, of the rigid decorative coating is 78 or more.

7. A watch comprising an exterior part of which at least one portion comprises the rigid decorative member according to claim 1.

8. A method for producing the rigid decorative member according to claim 1, comprising forming the rigid decorative coating layer by a reactive sputtering method using an alloy target of Ti and one or two or more metals selected from Nb, Ta, and V.

9. The method for producing a rigid decorative member according to claim 8, wherein a reactant gas containing the non-metallic element is used in the reactive sputtering method; and the gradient adhesion layer and the golden adjustment gradient layer are formed by chronologically increasing or decreasing the amount of the reactant gas containing the non-metallic element.

* * * * *